United States Patent
Ali et al.

(10) Patent No.: US 6,836,026 B1
(45) Date of Patent: Dec. 28, 2004

(54) INTEGRATED CIRCUIT DESIGN FOR BOTH INPUT OUTPUT LIMITED AND CORE LIMITED INTEGRATED CIRCUITS

(75) Inventors: Anwar Ali, San Jose, CA (US); Tauman T. Lau, San Jose, CA (US); Max M. Young, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/614,402

(22) Filed: Jul. 3, 2003

Related U.S. Application Data

(60) Provisional application No. 60/439,878, filed on Jan. 14, 2003.

(51) Int. Cl.[7] .............................................. H01L 23/48
(52) U.S. Cl. ..................... 257/786; 257/691; 257/202; 257/203
(58) Field of Search ................................ 257/786, 202, 257/203, 691

(56) References Cited

U.S. PATENT DOCUMENTS

| | | | |
|---|---|---|---|
| 6,057,169 A | | 5/2000 | Singh et al. |
| 6,078,068 A | * | 6/2000 | Tamura ..................... 257/203 |
| 6,159,826 A | | 12/2000 | Kim et al. |
| 6,222,213 B1 | * | 4/2001 | Fujiwara ................... 257/210 |
| 6,242,814 B1 | | 6/2001 | Bassett |
| 6,310,402 B1 | * | 10/2001 | Watanabe ................... 257/784 |
| 2001/0011768 A1 | * | 8/2001 | Kohara et al. .............. 257/692 |

FOREIGN PATENT DOCUMENTS

| | | | | |
|---|---|---|---|---|
| EP | 0563973 A2 | * | 1/1993 | ................. 257/786 |
| JP | 62-230028 | * | 10/1987 | ................. 257/786 |
| JP | 63-250144 | * | 10/1988 | ................. 257/786 |
| JP | 3-138972 | * | 6/1991 | ................. 257/786 |

OTHER PUBLICATIONS

"Circuit Component Placement", Ali, Anwar et al., Ser. No. 10/140,965, filed. May 8, 2002.

* cited by examiner

*Primary Examiner*—Jasmine Clark
(74) *Attorney, Agent, or Firm*—Conley Rose, P.C.

(57) ABSTRACT

Various integrated circuits (ICs) are provided. One IC includes bonding pads and an input output (I/O) region surrounding a core region. The I/O region includes I/O cells having a width approximately equal to or less than a width of the bonding pads. The IC also includes core logic arranged within the I/O region. Another IC includes four rows of bonding pads. Each row is arranged parallel to a different side of a core region. I/O sub-regions are arranged proximate each side of the core region. Each I/O sub-region includes I/O cells and core logic. An additional IC includes a first I/O region surrounding a core region and a second I/O region surrounding the first I/O region. The IC also includes bonding pads arranged outside of I/O cells in the first and second I/O regions. A width of the I/O cells is approximately equal to a pitch of the bonding pads.

20 Claims, 4 Drawing Sheets

INTEGRATED CIRCUIT DESIGN FOR BOTH INPUT OUTPUT LIMITED AND CORE LIMITED INTEGRATED CIRCUITS

PRIORITY CLAIM

This application claims priority to U.S. Provisional Application No. 60/439,878 entitled "IO Cell Packing Scheme for IO and Core Limited Semiconductor Designs," filed Jan. 14, 2003.

BACKGROUND OF THE INVENTION

1. Field of Invention

This invention relates to integrated circuits, and more particularly to input output cell designs for both input output limited integrated circuits and core limited integrated circuits.

2. Description of Related Art

The following descriptions and examples are not admitted to be prior art by virtue of their inclusion within this section.

Integrated circuits such as application specific integrated circuits (ASICs) and application specific standard products (ASSPs) can be categorized as either input output (I/O) limited integrated circuits (ICs) or core limited ICs. For I/O limited designs, the number of I/O cells dictates the size of the die. In this scenario, it is generally desirable to use tall but narrow I/O cells to minimize the die size. For example, current approaches for I/O limited IC designs include placing the I/O cells around the periphery of the die. Therefore, the total chip size is driven by the width of the I/O cells. As a result, I/O cells should ideally be as narrow as possible. However, a fixed silicon area is required for the I/O circuit structures. Consequently, the I/O cell height is increased to accommodate the decrease in width.

For core limited designs, the size of the core logic region dictates the die size. In this scenario, short but wide I/O cells free more area on the die for core logic. For example, current approaches for core limited IC designs include placing I/O cells around the periphery of the die. However, the total chip size is driven by the size of the core logic area. Therefore, for a given total chip size, making I/O cells as short as possible increases the area provided for core logic. As a result, I/O cells should ideally be as short as possible. However, a fixed silicon area is required for the I/O circuit structures. Consequently, the I/O cell width is increased to accommodate the decrease in height.

Creating a combined I/O and core limited solution, therefore, presents a problem since I/O cells that are narrow and tall benefit I/O limited designs, but I/O cells that are short and wide benefit core limited designs. To address both I/O and core limited designs, I/O circuit and chip designers use one or more of the following approaches. For example, I/O cell developers may compromise the aspect ratio of the I/O cell by creating an I/O cell that is not as narrow as possible and not as short as possible thereby creating a tradeoff between the two extremes. Alternatively, I/O cell developers may create two separate physical layouts, one for each I/O type of device. One layout may include narrow but tall I/O cells that are optimized for I/O limited designs. The other layout may include short but wide I/O cells that are optimized for core limited designs.

There are, however, several disadvantages to the current approaches for addressing both types of limited designs. For example, when the I/O cell aspect ratio is compromised, neither I/O limited nor core limited designs are fully optimized. In particular, for an I/O limited IC, a wider than necessary I/O cell will increase the I/O limited die size even though the core area of the chip is underutilized. For a core limited IC, a taller than required I/O cell will decrease the available core area in the core limited design even though some sections of the I/O region are underutilized. In another example, compromising the I/O cell aspect ratio requires careful consideration by the I/O circuit designer to ensure that I/O and/or core limited designs are not over-penalized.

In such an approach, a breakdown of projected I/O and core limited designs and actual die sizes is estimated as well as projections for manufacturing volumes and revenues for each design over the life of the semiconductor technology. Incorrect assessment of this tradeoff becomes difficult to correct once I/O libraries are released. Furthermore, due to the complexity of the aspect ratio assessment, the overall I/O library development time is increased. Moreover, in many cases, projected die sizes, volumes, and revenues are nearly impossible to predict, and as a result, non-ideal solutions may be deployed. The non-ideal solutions are accepted and used at the expense of increased total chip size and die cost.

Creating separate layouts is an alternative solution that addresses both I/O and core limited applications. However, developing and maintaining separate I/O layouts requires more effort from circuit designers. Additionally, the timing and performance characteristics of each layout version must be identical such that they can be used interchangeably on a semiconductor design, which impacts the chip level operation. In addition, exclusive use of either I/O or core limited cell versions may cause a design that is originally I/O limited to become core limited or vice versa. As a result, semiconductor applications will require the combined use of both I/O and core limited I/O layout versions to ensure that the total chip size is optimized. The chip designer must, therefore, switch I/O or core limited I/O layout versions on an I/O cell specific basis until the optimum die size is reached. These iterations increase the design complexity and the design time.

Accordingly, it may be desirable to provide an I/O cell layout and I/O cell aspect ratio that is optimal for both I/O and core limited designs thereby decreasing die waste area and die cost and eliminating the compromise between the I/O aspect ratio currently used to balance the I/O and core limited designs.

SUMMARY OF THE INVENTION

The problems outlined above may be in large part addressed by an integrated circuit (IC) that includes bonding pads and an input output (I/O) region surrounding a core region. The I/O region includes I/O cells. A width of the I/O cells is approximately equal to or less than a width of the bonding pads. In this manner, the I/O cells may be designed as I/O cells of an I/O limited IC. In addition, an aspect ratio of the I/O cells may be greater than about 2. Furthermore, a height of the I/O cells may be approximately equal to an area sufficient for components of the I/O cells divided by the width.

This I/O limited IC design, however, may be easily modified for a core limited IC. For example, core logic may be arranged within the I/O region. In this manner, an I/O limited IC design may be modified to accommodate a core limited IC without modifying the I/O cells (i.e., the dimensions of the I/O cells may be the same for an I/O limited IC design and a core limited IC design). Instead, space within the I/O region originally allocated for I/O cells in the I/O limited IC design may be reallocated for core logic to accommodate a core limited IC.

In one embodiment, the I/O cells may be arranged into continuous groups with space between the continuous groups for the core logic. In another embodiment, the core logic may occupy a continuous area of the I/O region equal to or greater than an area of at least two of the I/O cells. The core logic may also be arranged into more than one core logic areas within the I/O region. In some embodiments, the core logic may extend from the core region beyond an outermost boundary of the I/O region. A width of the core logic may be less than a width of the core region.

In an additional embodiment, the I/O region may include 4 I/O sub-regions. Each of the 4 I/O sub-regions may be arranged proximate a different side of the core region. A portion of each of the 4 I/O sub-regions may include core logic. In addition, the I/O cells may be arranged on each side of the core region. In some embodiments, the bonding pads may be arranged in one row spaced from the I/O region. In a different embodiment, the bonding pads may be arranged in first and second rows. The second row may be spaced farther from the I/O region than the first row. The integrated circuit may be further configured as described herein.

Another embodiment relates to an IC that includes 4 groups of bonding pads. Each of the groups of bonding pads is arranged along an axis parallel to a different side of a core region. This integrated circuit also includes I/O sub-regions arranged proximate each of the different sides of the core region. A first portion of each of the I/O sub-regions includes I/O cells, and a second portion of each of the I/O sub-regions includes core logic. A width of the I/O cells may be approximately equal to or less than a width of the bonding pads. In this manner, the I/O cells may be designed for an I/O limited IC. However, the IC may be a core limited IC. For example, replacing I/O cells with core logic in the I/O sub-regions may increase the space allocated for core logic sufficiently to accommodate a core limited IC without redesigning the I/O cell layout or dimensions. The integrated circuit may be further configured as described herein.

An additional embodiment relates to an IC that includes a first I/O region surrounding a core region. The first I/O region includes first I/O cells. The IC also includes a second I/O region surrounding the first I/O region. The second I/O region includes second I/O cells. In addition, the IC includes bonding pads coupled to the first and second I/O regions and arranged outside of the first and second I/O cells. A width of the first and second I/O cells is approximately equal to a pitch of the bonding pads. In addition, a height of the first and second I/O cells may be approximately equal to an area sufficient for components of the first and second I/O cells divided by the width. Furthermore, an aspect ratio of the first and second I/O cells is approximately equal to or less than about 0.5. In this manner, the I/O cells are designed for a core limited IC.

However, this IC may be an I/O limited IC. For example, the first and second I/O regions may provide sufficient I/O capacity for an I/O limited IC even though the I/O cells are designed for a core limited IC. The first or the second I/O region may be placed in space normally allocated for the core region of a core limited IC since an I/O limited IC generally will not need as much core region area as a core limited IC. In this manner, a core limited IC design may be modified for an I/O limited IC without altering the I/O cell layout or I/O cell dimensions of the core limited IC design. The integrated circuit may be further configured as described herein.

BRIEF DESCRIPTION OF THE DRAWINGS

Other objects and advantages of the invention will become apparent upon reading the following detailed description and upon reference to the accompanying drawings in which.

Figure 1:
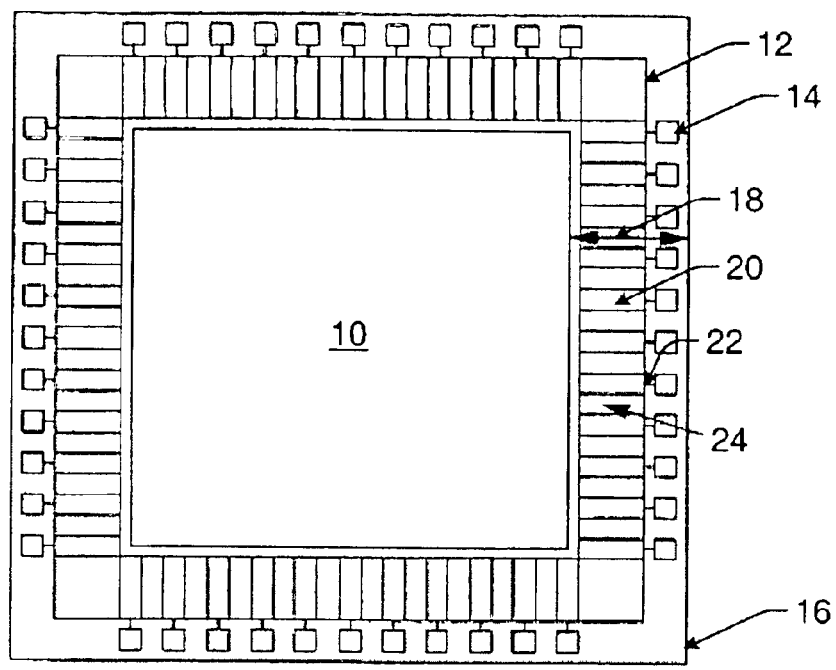
FIGS. 1 and 2 are schematic diagrams illustrating a plan view of different core limited integrated circuit layouts.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

The following description generally relates to input output (I/O) cell placement and I/O aspect ratio designs that are optimal for both I/O and core limited integrated circuit (IC) designs. One approach described herein optimizes I/O cells for I/O limited IC designs by making the I/O cells as narrow as possible with increased height. In core limited scenarios, these I/O cells are arranged in groups within the I/O region thereby freeing space in the I/O region for core logic circuitry. The techniques described herein also allow a single I/O library to be used for both I/O and core limited IC designs without die area waste and remove the need to compromise the I/O aspect ratio to balance I/O and core limited designs. As such, the following description presents an I/O cell architecture and I/O placement method that addresses both types of IC design in a unified manner.

The term "integrated circuit" is used herein to refer to a logic device such as an application specific integrated circuit (ASIC) and an application specific standard product (ASSP). In addition, an integrated circuit may include any integrated circuit in which I/O devices are placed around and near the die periphery. As used herein, the term "bonding pad" is generally defined as a site on a die for bonding wire or flipchip attachment to a package. The term "core region" is used herein to refer to a region of an integrated circuit where core logic, standard non-I/O devices, and macros are placed. The core region typically occupies a majority of the die area with exception to the I/O region. The core region may also be commonly referred to as a "core area."

As used herein, the term "I/O region" is used to refer to a region of an IC in which I/O devices are placed. The I/O region is usually arranged around the die perimeter. The term "I/O device" generally refers to an input and/or output device that is used to interface core logic with the external IC environment. In addition, the term "pad wire" generally refers to a wire that is used to connect a bonding pad to an I/O device. A pad wire may be formed using metal routing layers of a semiconductor design.

The term "core limited IC" generally refers to an IC having a relatively high core logic count but a relatively small I/O count such that the die size is a direct function of the core logic gate count (i.e., the space required by the core logic region). Additionally, increasing the core logic gate count increases the die size. Core limited designs usually have a single row of bonding pads. A single row of bonding pads allows I/O devices to be placed closer to the die edge thereby resulting in an increased area for core logic. In a core limited IC, there is typically ample surface area for the space requirements of the I/O cells.

The term "I/O limited IC" generally refers to an IC having a relatively large I/O count but a relatively small core logic count such that the die size is a direct function of the I/O count (i.e., the space required by I/O cells). In other words, increasing the I/O count will increase the die size. I/O limited designs typically use two or more bonding pad rows to support the high I/O count. The use of multiple bonding pad rows places I/O devices farther towards the die center thereby reducing the area provided for the core region. However, since the design is I/O limited, a reduction in the usable core region is typically acceptable since there is usually ample surface area for the space requirements of the core region. The term "pad limited IC" may be used interchangeably with the term "I/O limited IC."

Turning to the drawings, FIG. 1 illustrates one example of a core limited IC layout. As shown in FIG. 1, the core limited IC layout includes core region 10. The core logic, standard non-I/O devices, and macros for the IC are formed within core region 10. Core region 10 is surrounded by I/O region 12. For example, the I/O region is arranged proximate all four outer lateral edges of the core region. Bonding pads 14 are arranged between the I/O region and the periphery of die 16. In particular, the bonding pads are arranged proximate the periphery of the die on all four sides of the die. The bonding pads are arranged in a single row to allow a larger core region. For example, the single row of bonding pads allows distance 18 between an outer lateral edge of the core region and the periphery of the die to be smaller than if the IC layout included more than one row of bonding pads. Reducing distance 18 increases the area of the core region.

The I/O region, in this example, includes I/O cells 20. As shown in FIG. 1, I/O devices in the I/O cells are coupled to the bonding pads by pad wires 22. In addition, I/O devices in the I/O cells are coupled to core logic in the core region by signal traces (not shown). As shown in FIG. 1, I/O cells 20 have a width (i.e., a lateral dimension of the I/O cells in a direction substantially parallel to the outer lateral edge of the die closest to I/O cells) approximately equal to a width of bonding pads 14 (i.e., a lateral dimension in the same direction defined above). Filler cells 24 may be placed between adjacent I/O cells 20. In this manner, every other cell in I/O region 12 may be an I/O cell, with filler cells placed between the I/O cells.

Therefore, the I/O cells will be spaced apart by approximately the same distance by which the bonding pads are spaced apart. The space between the bonding pads is usually set as the minimum distance allowable by other design constraints of the IC such as the bonding requirements specified by the packaging elements and packaging processes. In this manner, the distance between the bonding pads may be different for different technologies. For example, a flip chip IC will tend to have different criteria for the minimum spacing between adjacent bonding pads than a wire bonded IC. In this manner, the filler cells are used to occupy the space between the I/O cells. The space on the die that is occupied by the filler cells, however, is essentially wasted silicon area. As such, it may be desirable to eliminate the filler cells to reduce the die size and/or the die cost.

Figure 2:
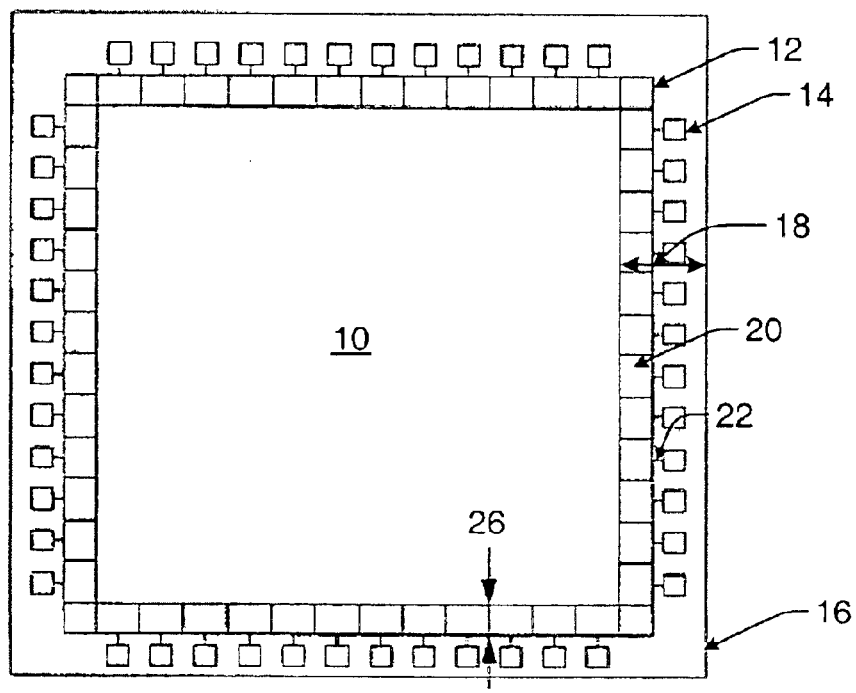

One alternative core limited IC design layout is illustrated in FIG. 2. Elements of FIGS. 1 and 2 that may be similarly configured have been indicated with the same reference numerals. The layout illustrated in FIG. 2 is similar to that shown in FIG. 1 except the dimensions of the I/O cells are different in the two figures. The dimensions of the I/O cells also change the area of the core region shown in FIGS. 1 and 2. For example, as shown in FIG. 1, the width of the I/O cells is approximately equal to a width of the bonding pads. Therefore, in order to accommodate the I/O devices, the length of the I/O cells (i.e., a lateral dimension of the I/O cells in a direction substantially perpendicular to the outer lateral edge of the die closest to I/O cells) is substantially greater than the width of the I/O cells. In this manner, the I/O cells extend relatively far into the die thereby reducing the amount of silicon space provided for the core region. In contrast, as shown in FIG. 2, the width of the I/O cells is increased such that the width is greater than a width of the bonding pads. In particular, the width of the I/O cells may be approximately equal to a pitch of the bonding pads. In addition, the width of the I/O cells is increased to allow little or no unused silicon between the I/O cells. In this manner, the substantial length of the I/O cells shown in FIG. 1 is not necessary to accommodate the I/O devices of FIG. 2. As such, length 26 of the I/O cells shown in FIG. 2 is substantially shorter than the length of the I/O cells shown in FIG. 1. Consequently, the I/O cells shown in FIG. 2 do not extend as far into the die as the I/O cells shown in FIG. 1 thereby reducing distance 18 between the core region and the periphery of the die. Therefore, the I/O cell design of FIG. 2 will provide a greater area for the core region of the IC than the I/O cell design of FIG. 1.

Figure 3:
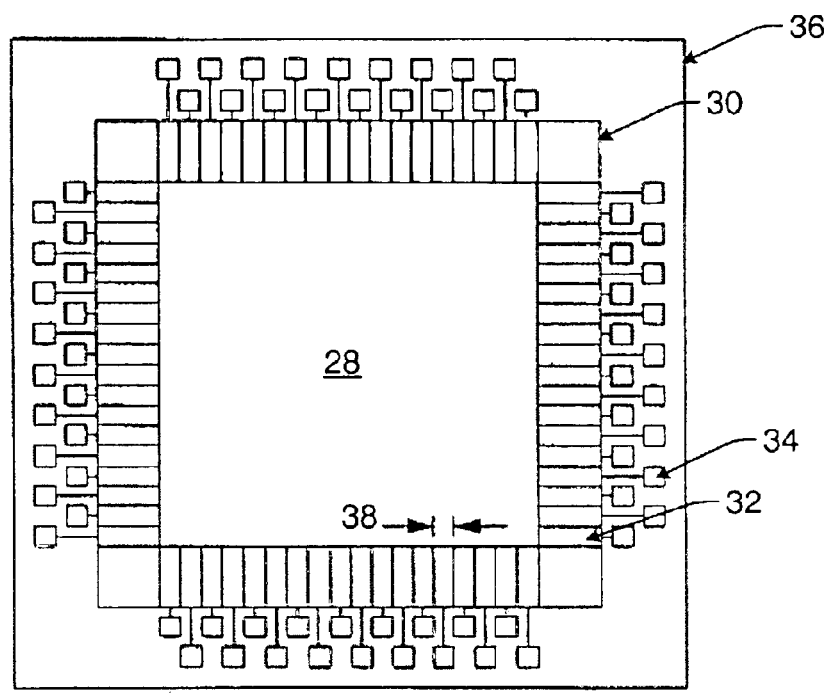
FIG. 3 is a schematic diagram illustrating a plan view of an input output limited integrated circuit layout.

FIG. 3 illustrates one example of a layout for an I/O limited IC. As shown in FIG. 3, core region 28 is surrounded by I/O region 30. The I/O region includes I/O cells 32. Bonding pads 34 are arranged between the I/O region and the periphery of die 36. Unlike the layouts of FIGS. 1 and 2, the bonding pads are arranged in more than one row in FIG. 3. In addition, the bonding pads are arranged in a staggered fashion (i.e., every other bonding pad is placed in a different row) to allow sufficient space between adjacent bonding pads while allowing more bonding pads to be placed proximate each side of the core region. Since the bonding pads occupy more space around the periphery of the die than a single row of bonding pads, the I/O region is moved closer to the center of the die than the I/O region shown in FIGS. 1 and 2 thereby reducing the area of the core region. However, the area of the core region may be reduced since this IC is not core limited.

Figure 4:
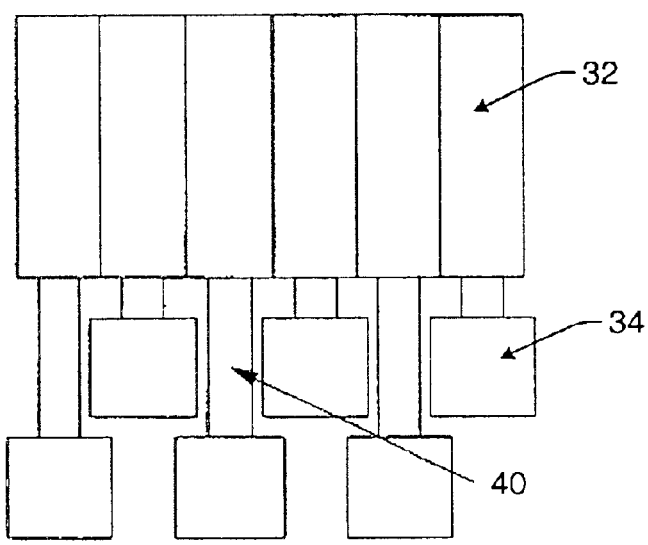
FIG. 4 is a schematic diagram illustrating a plan view of a portion of the input output limited integrated circuit layout of FIG. 3.

In an I/O limited IC, the I/O cells are typically narrow and tall, meaning that the length of the I/O cells along an edge that is substantially parallel to the peripheral edge of the die tends to be appreciably shorter than the length of I/O cells that is substantially perpendicular to the peripheral edge of the IC. For example, as shown in FIG. 3, the I/O limited IC design includes I/O cells 32 having width 38 that is approximately equal to the width of the bonding pads. In this manner, more I/O cells may be arranged on each side of the core region than if the I/O cells had a width that is greater than a width of the bonding pads. In addition, each available I/O slot in the I/O region may be configured as an I/O cell since the bonding pads are arranged in the staggered fashion. For example, every other I/O cell may be coupled to a bonding pad in a different row. As shown in FIG. 4, pad wires 40 may be used to couple each I/O cell to a bonding pad. Pad wires connecting I/O cells to bonding pads in the outer row may be routed between adjacent bonding pads. Therefore, more bonding pads per unit length may be arranged on each side of the core region.

In some embodiments, the I/O cells may have a width that is smaller than the width of the bonding pads such that wires can be routed between the I/O cells from the core region to the periphery of the die. The length of the I/O cells may be dictated by the width and the area that would be sufficient for the I/O devices of the I/O cells (i.e., the area divided by the width). The smaller width may result in a substantial length for the I/O cells thereby reducing the area allocated for the core region. However, this IC is not core limited, therefore, such a reduction in the core region area will not adversely affect the IC.

Figure 5:
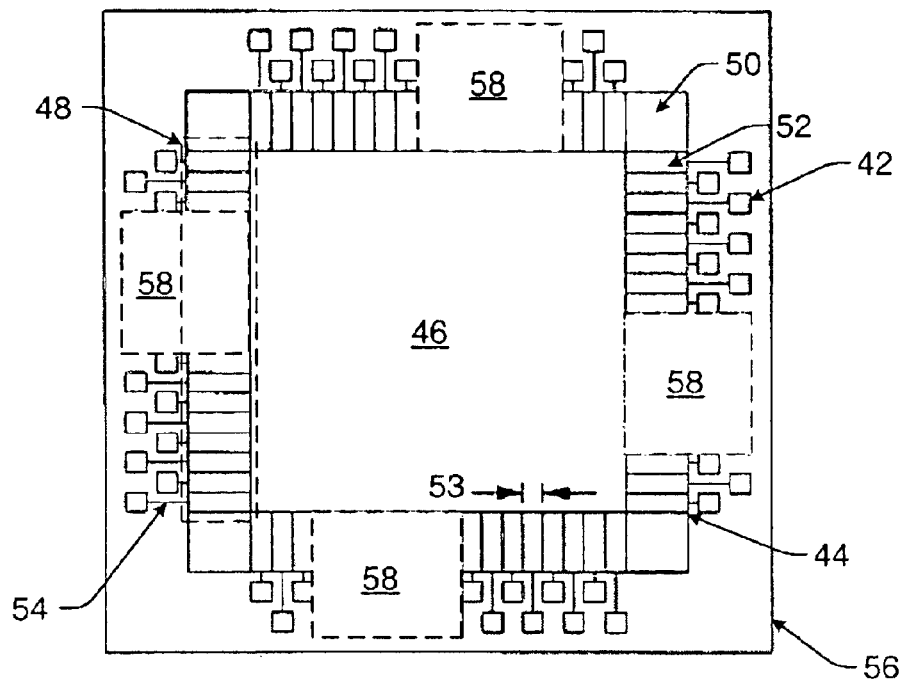
FIGS. 5–7 are schematic diagrams illustrating a plan view of different embodiments of a layout that can be used for both core limited integrated circuit designs and input output limited integrated circuit designs.

FIG. 5 illustrates a layout of an IC design that is suitable for a core limited IC even though the design has several characteristics of an I/O limited design. The core limited IC includes bonding pads 42. In this embodiment, the bonding pads are arranged in two rows as described in FIG. 3. The second row of bonding pads is spaced farther from the I/O region than the first row of bonding pads. The IC may also include more than two rows of bonding pads. In addition, the IC includes at least four groups of bonding pads. Each of the groups is arranged along an axis parallel to a different side of core region 46. In this manner, the IC includes at least one row of bonding pads arranged into four groups that are arranged on each side of the core region.

The IC also includes I/O region 44 surrounding core region 46. As shown in FIG. 5, the I/O region is arranged proximate each different side of the core region such that the I/O region completely encompasses the core region. In particular, the I/O region includes 4 I/O sub-regions 48. As shown in FIG. 5, each I/O sub-region has a width (defined in the direction described above) that is approximately equal to a width of the core region. In addition, each of the 4 I/O sub-regions is arranged proximate a different side of the core region. In this manner, the 4 I/O sub-regions in combination with corner areas 50 of the I/O region completely encircle the core region. The I/O region shown in FIG. 5 may also be commonly referred to as an "I/O ring."

The I/O region includes I/O cells 52. As shown in FIG. 5, I/O cells 52 are arranged on each side of core region 46. Each I/O cell is coupled to a bonding pad by pad wires 54. As shown in FIG. 5, width 53 of the I/O cells is approximately equal to a width of the bonding pads. However, the width of the I/O cells may be less than a width of the bonding pads, for example, to allow space for wiring to be routed between adjacent I/O cells. The wiring may be used to connect portions of the core region to the periphery of die 56 where elements such as ground and power bonding pads (not shown) may be placed. Any space allowed between I/O cells, however, may be narrower than the width of a single I/O cell and, thus, does not add substantially to the overall size of the die. A height of the I/O cells may be approximately equal to an area sufficient for components of the I/O cells divided by the width. Therefore, the height of the I/O cells is no greater than that necessary to enclose the required area of the I/O cell. In addition, an aspect ratio of the I/O cells may be greater than about 2. The aspect ratio of an I/O cell is defined as the height of the I/O cell divided by the width of the I/O cell.

Therefore, the I/O cells have lateral dimensions and aspect ratios that are suitable for the design of an I/O limited IC. In particular, the I/O cells may be built as narrow as possible and are, therefore, optimized for I/O limited designs. The tall and narrow design of I/O cells that is optimized for an I/O limited IC, however, is extremely inefficient for a core limited IC. The reason such I/O cells are inefficient for core limited ICs is that in a core limited IC, the I/O cells may be more widely spaced apart, because fewer of them are required. Thus, there tends to be a large amount of wasted surface area between the narrow I/O cells in such a design. However, the tall I/O cells tend to extend relatively far into the die of the integrated circuit, which for a core limited IC is already densely populated. Thus, the height of the tall and narrow I/O cells requires that the overall size of the substrate on which the IC is formed is increased to accommodate the length of the I/O cells. As a result, there is wasted space between the I/O cells thereby resulting in inefficient use of the substrate surface area and unnecessary increases in the cost of production of the IC. In addition, the bonding pads are arranged in more than one row in this embodiment. Therefore, the bonding pad arrangement is particularly suitable for the design of an I/O limited IC, not a core limited IC. As a result, the pad layout shown in FIG. 5 is not an efficient design for a core limited IC.

Comparison of the I/O limited design illustrated in FIG. 3 and the core limited design illustrated in FIG. 5 shows that there are many similarities between the two different designs (e.g., I/O cell width, height, and aspect ratio and bonding pad arrangement). In addition, I/O cells are placed around the die periphery for both I/O and core limited designs. However, there are also several important differences between the designs shown in FIGS. 3 and 5, which make the layout of FIG. 5 suitable for a core limited IC. For example, the layout of FIG. 5 includes core logic 58 arranged within I/O region 44. For core limited designs, the number of I/O cells needed for the IC may be arranged in continuous groups around the I/O region to create relatively large regions of empty silicon (or die) area within the I/O region. The free silicon area in the I/O region is used for core logic 58 in combination with the standard core region 46. The space for the core logic may be created between continuous groups of I/O cells, as shown in FIG. 5. Alternatively, the space for the core logic may be created adjacent to corner area 50 (i.e., between the corner area and a continuous group of I/O cells). In some embodiments, core logic 58 may occupy a continuous area in the I/O region equal to or greater than an area of at least two of the I/O cells. In this manner, the core logic area in the I/O region may occupy a space that is substantially larger than the space that might be occupied by devices that are arranged in only one I/O slot as "filler."

In one embodiment, the core logic arranged within the I/O region may extend from core region 46 beyond an outermost boundary of the I/O region. For example, as shown in FIG. 5, the core logic area in the I/O region may extend from the core region to an outermost lateral boundary that is approximately commensurate with an outermost lateral boundary of the bonding pad spaced farther from the core region. In another example, the core logic area in the I/O region may extend from the core region beyond the outermost lateral boundary of the outermost bonding pads. In this manner, the core logic areas in the I/O region may have a length (defined in the direction described above) that is greater than a length of the I/O cells. In addition, a width of the core logic area within the I/O region may be less than a width of the core region. For example, the width of the core logic area placed within each I/O sub-region may be limited by the number of I/O cells that is required within each I/O sub-region. In this manner, the core logic area may occupy only a portion of each I/O sub-region while I/O cells occupy the other portion of each I/O sub-region.

Figure 6:
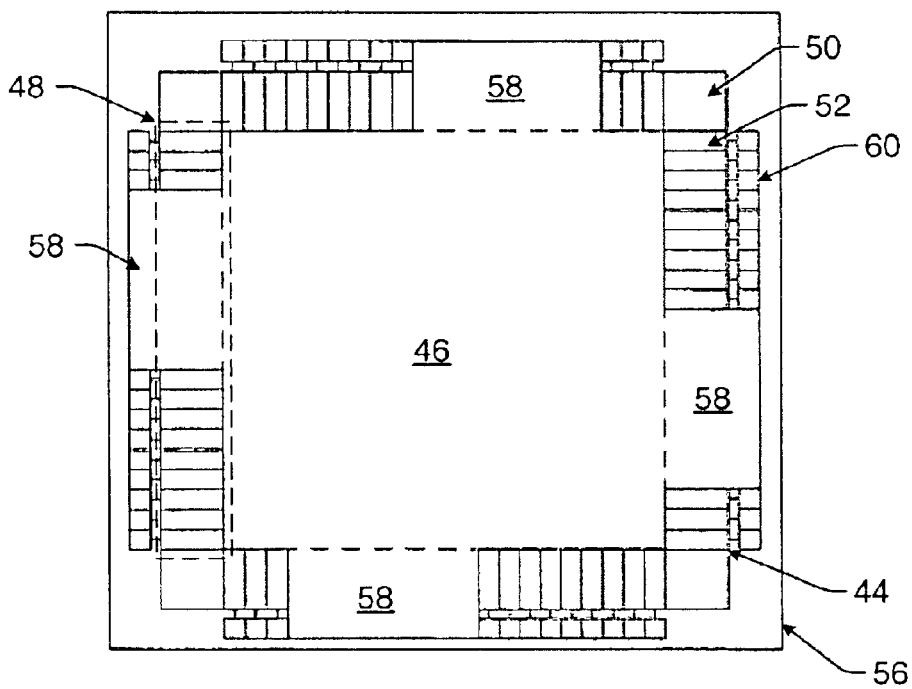

FIG. 6 illustrates a different layout of an IC design that is suitable for a core limited IC even though the design has several characteristics of an I/O limited design. The IC may be configured as described with respect to FIG. 5 with exception to the differences described below. In this manner, elements of FIGS. 5 and 6 that may be similarly configured have been indicated with the same reference numerals. This embodiment of the core limited IC includes bonding pads 60. In this embodiment, bonding pads 60 are arranged in one row spaced from the I/O region. In this manner, the layout of this embodiment provides more space for the standard core region 46 than the layout shown in FIG. 5. As such, the amount of core logic 58 arranged within the I/O region shown in FIG. 6 may be different than the amount of core logic arranged within I/O region of FIG. 5. In addition, the core logic arranged within the I/O region shown in FIG. 6 has different lateral dimensions than the lateral dimensions of the core logic arranged within the I/O region of FIG. 5.

Although core logic is arranged within each I/O sub-region of the layouts shown in FIGS. 5 and 6, it is to be understood that core logic may be arranged within 3 or less of the I/O sub-regions. Moreover, although FIGS. 5 and 6 illustrate one core logic area arranged within an I/O sub-region, it is to be understood that one or more separate core logic areas may be arranged within an I/O sub-region. The different core logic areas may be separated within the I/O sub-regions by I/O cells. Alternatively, the different core logic areas may be separated within the I/O sub-regions by another physical boundary such as free silicon area.

The layouts illustrated in FIGS. 5 and 6 have many characteristics suitable for an I/O limited IC design such as relatively narrow and long I/O cells. However, these layouts are easily modified to a design suitable for a core limited IC by modifying the I/O region to include core logic. Therefore, the design may be modified without altering the lateral dimensions of the I/O cells, the aspect ratio of the I/O cells, and the layout of the I/O cells and the bonding pads. Instead, since a core limited IC requires fewer I/O cells than an I/O limited IC, the I/O cells that are not needed in the I/O limited design for the core limited IC may be replaced with core logic by grouping individual I/O cells into continuous groups of I/O cells thereby freeing silicon area within the I/O region for the core logic.

There are, therefore, several advantages to the designs illustrated in FIGS. 5 and 6. For example, the semiconductor die area may be easily optimized for both I/O and core limited designs by modifying the layouts illustrated in FIGS. 5 and 6 as described above. In addition, no aspect ratio tradeoffs, which are described in more detail above, are necessary. For example, the I/O cell aspect ratios of FIGS. 5 and 6 are always optimized for I/O limited IC designs. The I/O cell aspect ratios do not adversely affect a core limited IC design since the reduction in the standard core region caused by such aspect ratios is offset by the core logic that is placed within the I/O region. Furthermore, the designs illustrated in FIGS. 5 and 6 reduce the IC development time since different I/O cells do not have to be designed for each type of IC. Additionally, the layouts shown in FIGS. 5 and 6 reduce the risk of misjudging projected design requirements since the designs are not based on assessments of such requirements. Moreover, the optimization of both I/O limited designs and core limited designs is achieved using a single I/O library. Separate I/O and core limited I/O library versions are not required.

Such advantages are significant particularly because most ICs tend to be I/O limited rather than core limited. Consequently, many I/O cell designs are available for use in an I/O limited IC design. However, it is complicated and time consuming to develop a new I/O cell design, and such a design for a core limited IC would tend to be used very little. Therefore, many designers use the I/O cells that are designed for I/O limited ICs for core limited IC designs to reduce the time and expense of designing I/O cells for the core limited ICs. Although this results in an IC that is more expensive than necessary, it is often less expensive than taking the time to create a new core limited I/O cell design. In contrast, the above designs may be easily optimized for both I/O and core limited ICs without redesigning the I/O cells.

Figure 7:
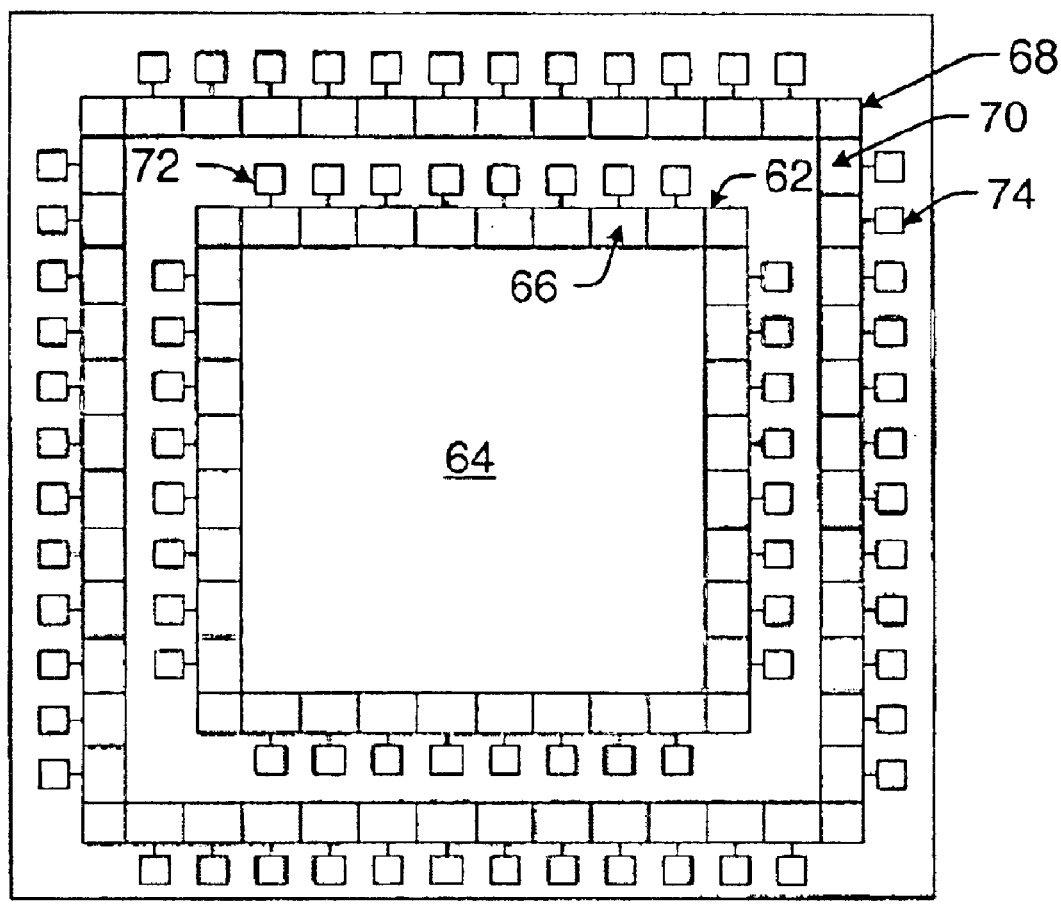

FIG. 7 illustrates a layout of an IC design that is suitable for an I/O limited IC even though the design has several characteristics of a core limited design. The I/O limited IC includes first I/O region 62 surrounding core region 64. The first I/O region includes first I/O cells 66. In addition, the IC includes second I/O region 68, which surrounds I/O, region 62. I/O region 68 includes second I/O cells 70. The IC also includes bonding pads 72 coupled to the I/O cells of I/O region 62 and bonding pads 74 coupled to the I/O cells of I/O region 68. Bonding pads 72 and 74 are arranged outside of the I/O cells to which they are coupled. The bonding pads are coupled to the I/O cells by pad wires, which may be configured as described above.

As shown in FIG. 7, I/O cells 66 and I/O cells 70 may have the same dimensions and aspect ratios. However, I/O cells 66 and I/O cells 70 may also have different dimensions and/or different aspect ratios. A width of I/O cells 66 and I/O cells 70 may be approximately equal to a pitch of bonding pads 72 and 74, respectively. The pitch of the bonding pads will vary depending upon, for example, the IC technology as described above. In addition, a height of I/O cells 66 and 70 is approximately equal to an area sufficient for components of the first and second I/O cells divided by the width of the I/O cells. Furthermore, an aspect ratio of I/O cells 66 and 70 may be approximately equal to or less than about 0.5. Therefore, the I/O cells have lateral dimensions and aspect ratios that are suitable for the design of a core limited IC. In particular, the I/O cells may be built as short as possible and are, therefore, optimized for core limited designs. Although such dimensions require that the I/O cell width is increased, such dimensions are suitable for a core limited IC. In addition, the bonding pads are arranged in one row surrounding each I/O region. Therefore, the bonding pad arrangement is similar to that of a design optimized for a core limited IC, not an I/O limited IC.

If the layout illustrated in FIG. 7 were modified to include only one of the I/O regions (e.g., I/O region 68), the layout would be suitable for a core limited IC. However, as shown in FIG. 7, an additional I/O region 62 and corresponding bonding pads are added to the layout to add a sufficient number of I/O cells thereby making the core limited IC design suitable for an I/O limited IC. Although adding the additional I/O region to the layout decreases the area of the core region, the decreased core region area will not adversely affect the I/O limited IC. In this manner, the I/O devices may be placed in multiple rows, or multiple I/O rings, to make efficient use of the die area for I/O limited designs. Such an easily modifiable layout has many of the same advantages described above.

Further modifications and alternative embodiments of various aspects of the invention may be apparent to those skilled in the art in view of this description. For example, integrated circuit designs that are suitable for both input output limited integrated circuits and core limited integrated circuits are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An integrated circuit, comprising:

bonding pads;

an input output region surrounding a core region, wherein the input output region comprises input output cells, and wherein a width of each of the input output cells is approximately equal to or less than a width of each of the bonding pads; and core logic arranged within the input output region.

2. The integrated circuit of claim 1, wherein the input output cells are arranged into continuous groups with space between the continuous groups for the core logic.

3. The integrated circuit of claim 1, wherein the core logic occupies a continuous area of the input output region equal to or greater than an area of at least two of the input output cells.

4. The integrated circuit of claim 1, wherein the core logic extends from the core region beyond an outermost boundary of the input output region.

5. The integrated circuit of claim 1, wherein the core logic is further arranged into more than one core logic areas within the input output region.

6. The integrated circuit of claim 1, wherein a width of the core logic is less than a width of the core region.

7. The integrated circuit of claim 1, wherein the input output region comprises four input output sub-regions, wherein each of the four input output sub-regions is arranged proximate a different side of the core region, and wherein a portion of each of the four input output sub-regions comprises the core logic.

8. The integrated circuit of claim 1, wherein the input output cells are arranged on each side of the core region.

9. The integrated circuit of claim 1, wherein the integrated circuit comprises a core limited integrated circuit.

10. The integrated circuit of claim 1, wherein a height of the input output cells is approximately equal to an area sufficient for components of the input output cells divided by the width.

11. The integrated circuit of claim 1, wherein an aspect ratio of the input output cells is greater than about 2.

12. The integrated circuit of claim 1, wherein the bonding pads are arranged in one row spaced from the input output region.

13. The integrated circuit of claim 1, wherein the bonding pads are arranged in first and second rows, and wherein the second row is spaced farther from the input output region that the first row.

14. An integrated circuit, comprising:

four groups of bonding pads, wherein each of the groups of bonding pads is arranged along an axis parallel to a different side of a core region; and input output sub-regions arranged proximate each of the different sides of the core region, wherein a first portion of each of the input output sub-regions comprises input output cells, and wherein a second portion of each of the input output sub-regions comprises core logic.

15. The integrated circuit of claim 14, wherein a width of the input output cells is approximately equal to or less than a width of the bonding pads.

16. The integrated circuit of claim 14, wherein the integrated circuit comprises a core limited integrated circuit.

17. An integrated circuit, comprising:

a first input output region surrounding a core region, wherein the first input output region comprises first input output cells;

a second input output region surrounding the first input output region, wherein the second input output region comprises second input output cells; and bonding pads coupled to the first and second input output regions and arranged outside of the first and second input output cells, wherein a width of the first and second input output cells is approximately equal to a pitch of the bonding pads.

18. The integrated circuit of claim 17, wherein the integrated circuit comprises an input output limited integrated circuit.

19. The integrated circuit of claim 17, wherein a height of the first and second input output cells is approximately equal to an area sufficient for components of the first and second input output cells divided by the width.

20. The integrated circuit of claim 17, wherein an aspect ratio of the first and second input output cells is approximately equal to or less than about 0.5.

* * * * *